United States Patent
Ando et al.

(10) Patent No.: US 6,717,228 B2
(45) Date of Patent: Apr. 6, 2004

(54) INFRARED IMAGE SENSOR WITH TEMPERATURE COMPENSATION ELEMENT

(75) Inventors: Hiroshi Ando, Nagoya (JP); Hiroyuki Tarumi, Kariya (JP); Katsuyoshi Nishii, Okazaki (JP)

(73) Assignee: Denso Corporation, Kariya (JP)

( * ) Notice: Subject to any disclaimer, the term of this patent is extended or adjusted under 35 U.S.C. 154(b) by 313 days.

(21) Appl. No.: 09/838,173

(22) Filed: Apr. 20, 2001

(65) Prior Publication Data

US 2001/0035559 A1 Nov. 1, 2001

(30) Foreign Application Priority Data

Apr. 26, 2000 (JP) ......................... 2000-125843

(51) Int. Cl.$^7$ ...................... H01L 31/0203; H01L 29/04
(52) U.S. Cl. ...................... 257/443; 257/444; 257/442; 257/59; 257/72; 257/234; 257/291
(58) Field of Search ................................ 257/443, 444, 257/442, 59, 72, 234, 291, 232

(56) References Cited

FOREIGN PATENT DOCUMENTS

| JP | 8043208 | 2/1996 |
|----|---------|--------|
| JP | 09-218086 | * 8/1997 |

* cited by examiner

*Primary Examiner*—Minhloan Tran
*Assistant Examiner*—Tan Tran
(74) *Attorney, Agent, or Firm*—Posz & Bethards, PLC (57) ABSTRACT

An infrared image sensor has a sensor array composed of plural sensor elements and provided on a silicon substrate. A temperature compensation element is provided on the silicon substrate for each sensor element adjacently to the sensor element, and performs temperature correction to an output of the sensor element. Accordingly, the infrared image sensor can provide stable output even when environmental temperature varies.

18 Claims, 9 Drawing Sheets

INFRARED IMAGE SENSOR WITH TEMPERATURE COMPENSATION ELEMENT

CROSS REFERENCE TO RELATED APPLICATION

This application is based upon and claims the benefit of Japanese Patent Application No. 2000-125843 filed on Apr. 26, 2000, the contents of which are incorporated herein by reference.

BACKGROUND OF THE INVENTION

1. Field of the Invention

This invention relates to an infrared image sensor.

2. Description of the Related Art

Thermal type infrared sensors are usable in a non-cooled state for general-purpose, and have various types such as a thermopile type and a bolometer type. For example, JP-A-8-43208 proposes a bolometer type infrared sensor capable of measuring a temperature by utilizing a change in resistance.

In this kind of bolometer type infrared sensor, it has been studied to realize an infrared image sensor capable of providing a stable thermal image by comparing an output of an infrared detecting element and an output of a temperature compensation element (reference element). The temperature compensation element has the same characteristics as that of the detecting element and disposed at a position where it does not receive infrared radiation.

However, it is difficult to provide stable output due to a practical difference in characteristics between the infrared detecting element and the temperature compensation element. In general, a measuring instrument such as a Peltier element is used to keep an environmental temperature constant and to make the output stable. However, this method requires high cost, and large electric power consumption. Further, it is difficult to keep the environmental temperature constant even by the Peltier element in a space such as a passenger compartment of a vehicle where the environmental temperature varies largely.

SUMMARY OF THE INVENTION

The present invention has been made in view of the above problems. An object of the present invention is to provide an infrared image sensor capable of providing stable output even when an environmental temperature varies.

According to the present invention, an infrared image sensor has a plurality of sensor elements provided on a semiconductor substrate for providing thermal image data by receiving infrared radiation from a measurement member to measure a temperature of the measurement member, and a plurality of temperature compensation elements provided on the semiconductor substrate.

Each of the plurality of temperature compensation elements is arranged to be adjacent to or to overlap with a corresponding one of the plurality of sensor elements, for performing temperature correction to an output of the corresponding one of the plurality of sensor elements.

Accordingly, even when a temperature of the substrate varies, the difference in temperature between the each temperature compensation element and the corresponding one of the sensor elements can be minimized, thereby providing stable output.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

A first embodiment embodying the present invention is explained with reference to drawings. In the present embodiment, a bolometer type sensor element is used as a thermal type sensor element, and a sensor array is constituted by plural bolometer type sensor elements arranged in parallel.

Figure 1:
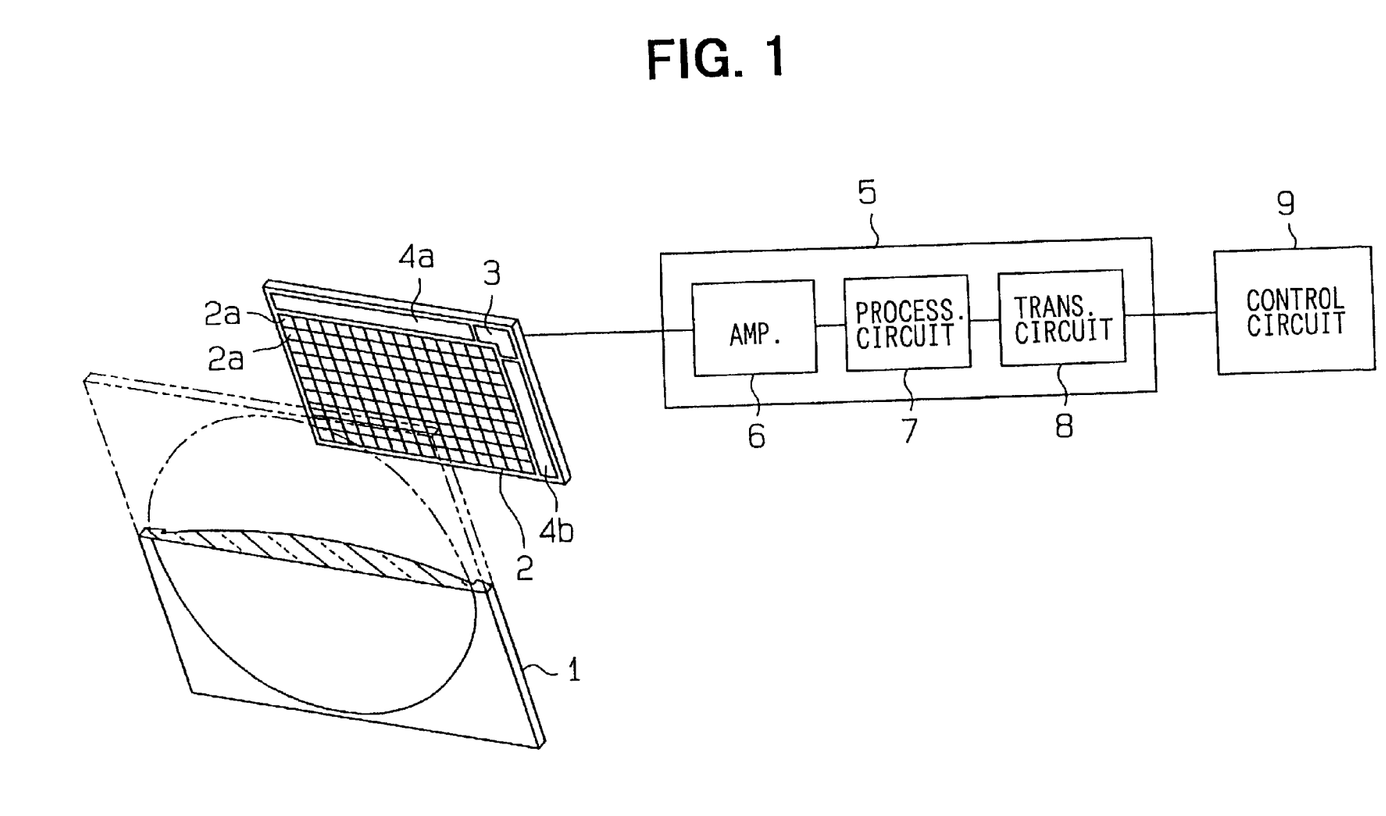
FIG. 1 is a schematic view showing a constitution of an infrared image sensor according to a first embodiment of the present invention.

FIG. 1 shows a constitution of an infrared image sensor in the present embodiment. The sensor has an infrared condenser lens 1 that is made of high-density polyethylene, chalcogen glass, $BaF_2$, ZnS, or the like. The infrared condenser lens 1 may have either of a spherical surface, a non-spherical surface, and a Fresnel lens shape. An infrared sensor array 2 is positioned remotely from the infrared condenser lens 1. The infrared sensor array 2 is composed of plural sensor elements 2a that are arranged, for example, to form a matrix of 15×10 collectively. A signal generation circuit 3 and selective circuits 4a, 4b are disposed on the periphery thereof. The signal generation circuit 3 generates a given voltage, and the selective circuits 4a, 4b select the sensor elements 2a of the sensor array 2 for outputting a signal in accordance with a quantity of infrared radiation.

Each structure of the sensor elements 2a constituting the infrared sensor array 2 is explained with reference to FIG. 2. A recess 12 is formed on a surface of a silicon substrate 11, and a $SiO_2$ thin film 13 is disposed on the surface of the silicon substrate 11 to close an opening portion of the recess 12. A metallic thin film resistor (metallic resistor) 14 is disposed on the $SiO_2$ thin film 13 above the opening portion of the recess 12, and an absorption film 16 is layered on the resistor 14 through a $SiO_2$ thin film 15 interposed therebetween. Thus, a layered member composed of the films 13, 14, 15, and 16 is disposed above the recess 12, and the inside of the recess 12 is closed, thereby forming a cavity 17.

In FIG. 1, a signal detecting/processing circuit 5 is connected to the infrared array 2. The signal detecting/processing circuit 5 includes a signal amplifier 6, a signal processing circuit 7, and a data transmission circuit 8. A various system control circuit 9 is connected to the signal detecting/processing circuit 5.

Figure 3:
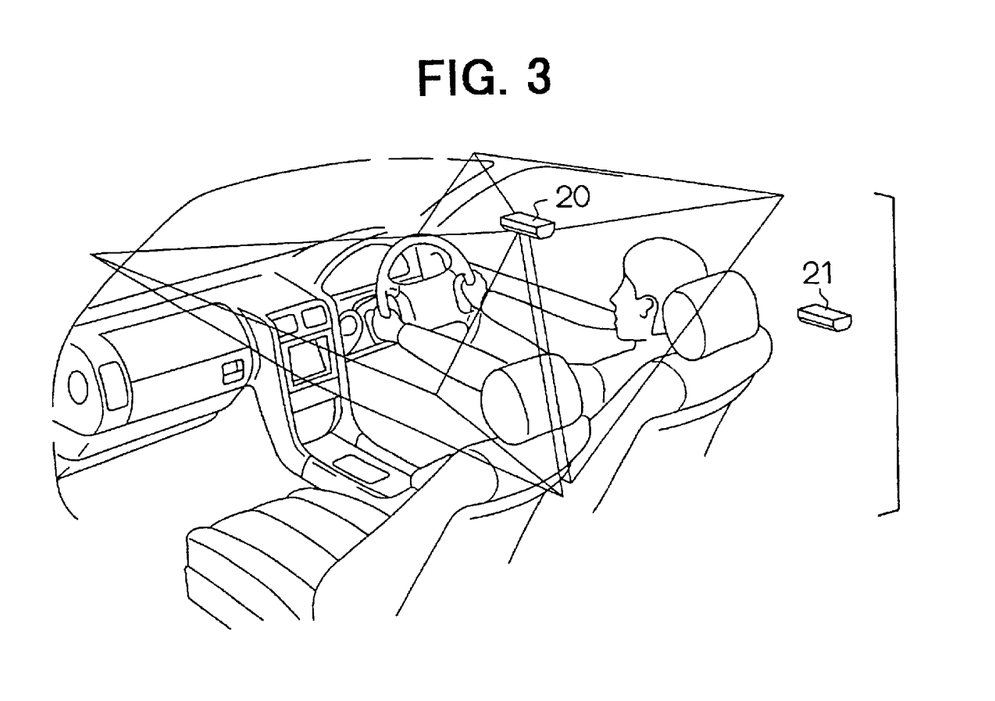
FIG. 3 is a perspective view showing a utilized state of the infrared image sensor as an example.

For example, the sensor is used as shown in FIG. 3. In FIG. 3, a sensor 20 for a front seat and a sensor 21 for a rear seat are attached to a ceiling of a passenger compartment of a vehicle. Each sensor is equipped with two sensor arrays, one of which includes sensor elements arranged in a dot matrix of 15×10.

Next, an operation of the sensors is explained. In each of the infrared image sensors 20, 21 installed as shown in FIG. 3, the infrared condenser lens 1 shown in FIG. 1 condenses infrared radiation in the vicinity of the seat, and forms a thermal image on the infrared sensor array 2. For example, the lens 1 is designed so that it can collect infrared radiation in an area of 750×500 mm at a position remote at 500 mm. When the number of the sensor elements 2a constituting the sensor array 2 is 15×10, an area (positional resolution) each sensor element 2a can detect is 50×50 mm.

Referring back to FIG. 2, in each sensor element 2a, infrared radiation incident thereon is absorbed by the absorption film 16, and is converted into heat. The $SiO_2$ film 13 can store the heat and externally insulates the sensor element 2a because it is suspended above the cavity 17 provided in the silicon substrate 11. The metallic thin film resistor 14 has resistance that changes with temperature. Therefore, the temperature of a measurement member (object to be measured) can be detected by measuring the change in resistance.

Thus, when infrared radiation is radiated from the measurement member to the sensor array 2 that is composed of plural bolometer type sensor elements 2a formed on the silicon substrate 11, each of the bolometer type sensor elements 2a can provide thermal image data in the sensor array 2. Then, in the signal detecting/processing circuit S shown in FIG. 1, the signal from the infrared sensor array 2 in accordance with the irradiated quantity of infrared radiation is amplified by the signal amplifier 6, and is processed by the signal processing circuit 7, for example, in comparison with a threshold value. The thus obtained signal (image data) is transmitted to the various system control circuit 9 through the data transmission circuit 8. In the system control circuit 9, detection data of whether a passenger or others is present at each seat or not, and of its position, which utilize the temperature detecting function of each pixel, can be used for air conditioning control of the passenger compartment using an air conditioner, expansion control of an air bag, security control and the like.

Figure 2:
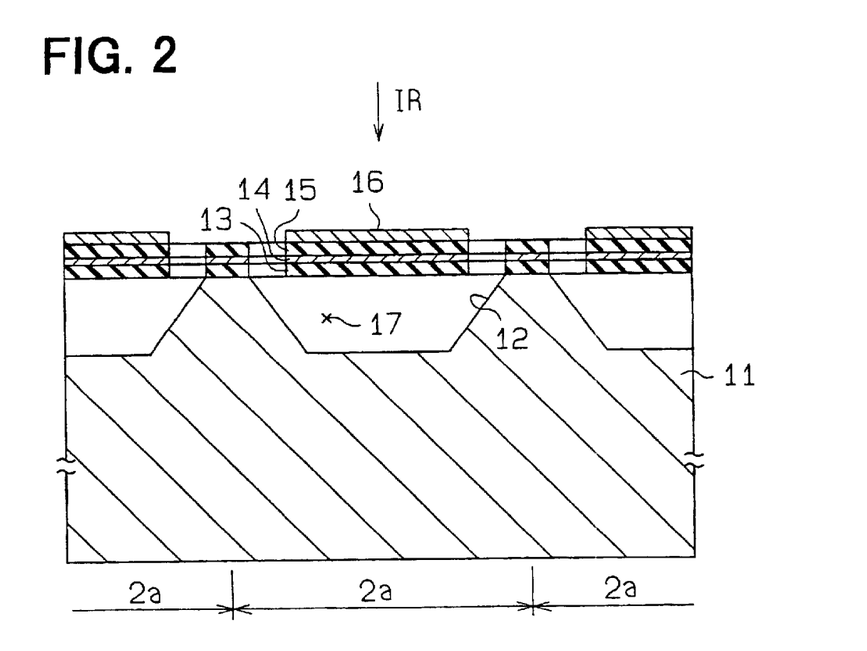
FIG. 2 is a cross-sectional view showing a sensor element.
Figure 4:
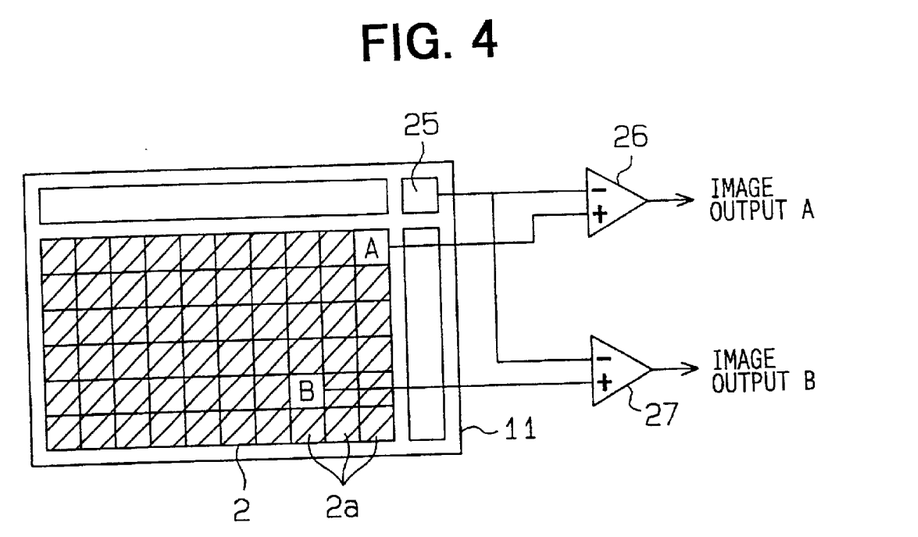
FIG. 4 is a schematic view for explaining an infrared image sensor as a comparative example.

Here, in order to obtain an absolute temperature by the change in resistance of the metallic thin film resistor 14 in each sensor element 2 shown in FIG. 2, it is necessary to detect only the change in temperature caused by infrared radiation incident thereon. Therefore, in this kind of bolometer type sensor, as shown in FIG. 4, a temperature compensation element (reference element) 25 is provided on the silicon substrate 11 in addition to the sensor elements 2a. Differential amplifiers 26, 27 determine the differences (difference of the change in resistance) between the respective sensor elements 2a and the temperature compensation element 25, and accordingly, the absolute value can be obtained. That is, the temperature compensation element 25 that is not influenced by the infrared radiation from the measurement member performs temperature correction to the outputs of the sensor elements 2a.

In case where the temperature compensation element 25 is independently arranged at a position on which no infrared radiation is incident, however, when there arises temperature distribution on the silicon substrate 11 holding the sensor array 2, differential output of the resistance may have an error due to the difference in substrate temperature between the part of the sensor elements 2a and the part of the temperature compensation element 25. Also, as to the resistances of the sensor elements 2a and the temperature compensation element 25, variations are liable to be increased due to the positional difference between the sensor elements 2a and the temperature compensation element 25. Therefore, the effects by the change in environmental temperature represented by the difference in resistance also vary. The compensation may be complicated, and it may become difficult to increase an amplification ratio for increasing a temperature resolution.

In this connection, the present embodiment adopts the following constitution.

Figure 5:
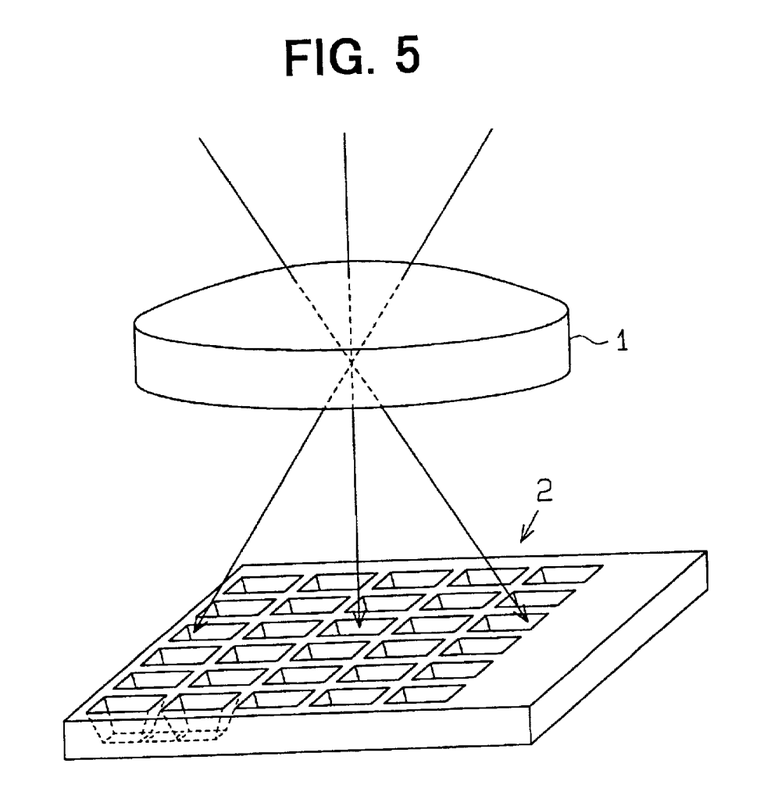
FIG. 5 is a perspective view for explaining the infrared image sensor in the first embodiment.
Figure 6:
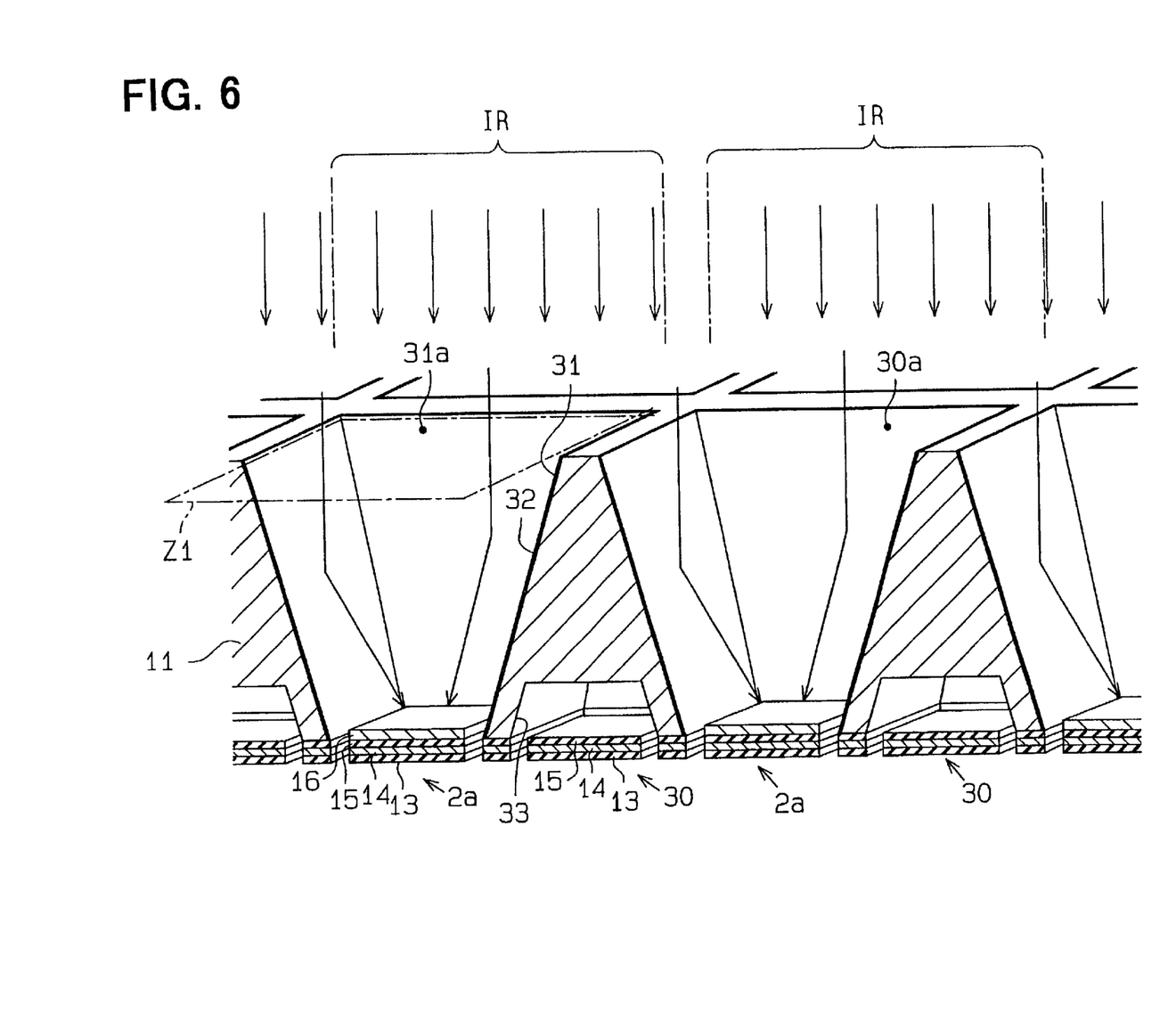
FIG. 6 is a perspective cross-sectional view for explaining the infrared image sensor in the first embodiment.

In the sensor array 2 on which infrared radiation condensed by the condenser lens 1 is incident as shown in FIG. 5, as shown in FIG. 6, temperature compensation elements 30 are formed for the respective sensor elements 2a at positions adjoining the respective sensor elements 2a on the silicon substrate 11. That is, each pixel (the part corresponding to each region of a detection area) in the silicon substrate 11 for forming the sensor array has one sensor element 2a and one temperature compensation element 30 provided adjacently to each other. Accordingly, the difference in temperature between the sensor element 2a and the temperature compensation element 30 can be reduced even when the substrate 11 has temperature distribution, in comparison with the case where the temperature compensation element is provided remotely from the sensor element.

In addition, the effects caused when the elements 2a, 30 undergo an identical change in temperature can be made the same by forming the elements 2a, 30 to have substantially the same shape and the same structure as each other. Specifically, the temperature compensation element 30 has a structure substantially the same as the membrane structure of the sensor element 2a explained referring to FIG. 2 except the absorption film 16 that is not provided in the temperature compensation element 30.

That is, in FIG. 6, the sensor element 2a has the layered membrane structure composed of the $SiO_2$ thin film 13, the metallic thin film resistor 14, the $SiO_2$ thin film 15 and the absorption film 16. On the other hand, the temperature compensation element 30 has a layered structure composed of the SiO$_2$ thin film 13, the metallic thin film resistor (metallic resistor) 14, and the SiO$_2$ thin film 15. In this case, the variation in resistance produced when the metallic thin film resistor 14 is formed can be minimized between the sensor element 2a and the temperature compensation element 30 because they are adjoining to each other. As a result, the differential output with respect to the temperature compensation element 30 can be provided stably with less error.

FIG. 6 is explained in more detail below.

When the sensor element 2a and the temperature compensation element 30 having substantially the same structure as each other are arranged simply to be adjacent to each other, at least a half of infrared radiation condensed by the condenser lens 1, which is incident on the temperature compensation element 30, would be wasted without being utilized.

In order to reduce this waste, in the present embodiment, as shown in FIG. 6, a through hole (cavity) 31 is formed from the back surface (irradiation surface) of the silicon substrate 11 where the sensor element 2a is formed, and the sensor element 2a having the membrane structure is formed on the side of the main surface (non-irradiation surface) of the silicon substrate 11. Thus, the bolometer type sensor element 2a is constructed by using the through hole 31 penetrating the silicon substrate 11. The through hole 31 has an opening portion 31a having a size larger than that of the membrane portion (the through hole 31 is tapered toward the sensor element 2a), so that infrared radiation can enter the opening portion 31a easily.

Further, the opening portion 31a of the through hole 31 constituting the bolometer type sensor element 2a is located to coincide with an imaging region of each region of the detection area by the condenser lens 1. That is, the lens 1 is designed as if the sensor element exists at the opening portion 31a of the through hole 31 as indicated by one-dot chain line Z in FIG. 6. Accordingly, infrared radiation can be gathered effectively on the pixel (sensor element) corresponding to each region of the detection area.

The opening portion 31a of the bolometer type sensor element 2a is arranged adjacently to another opening portion 31 of the adjacent sensor element 2a on the silicon substrate 11. That is, the opening portion 31a is provided in contact with the opening portion 31a of the adjacent pixel. Accordingly, condensed infrared radiation can be utilized without waste, i.e., can be utilized effectively.

Furthermore, in FIG. 6, a film 32 such as a deposition film having a high reflectance is coated on the side surface of the through hole (cavity) 31 constituting the bolometer type sensor element 2a, so that infrared radiation entering the opening portion 31a can be gathered onto the sensor element 2a without being absorbed by the side surface of the through hole 31. Accordingly, the waste of infrared radiation can be further reduced. The film 32 may be, for example, an aluminum thin film.

On the other hand, the temperature compensation element 30 is formed above a recess 33 that is formed on the main surface (non-irradiation surface) of the silicon substrate 11. The temperature compensation element 30 as well as the sensor element 2a adopts the membrane structure provided in an opening portion of the recess 33. Thus, the temperature compensation element 30 is constituted using the recess 33 that is open on the main surface of the silicon substrate 11 on which no infrared radiation is incident. Therefore, infrared radiation can be prevented from entering the temperature compensation element 30 without using a special cover.

The effects of the substrate temperature at that time are explained below.

Figure 7:
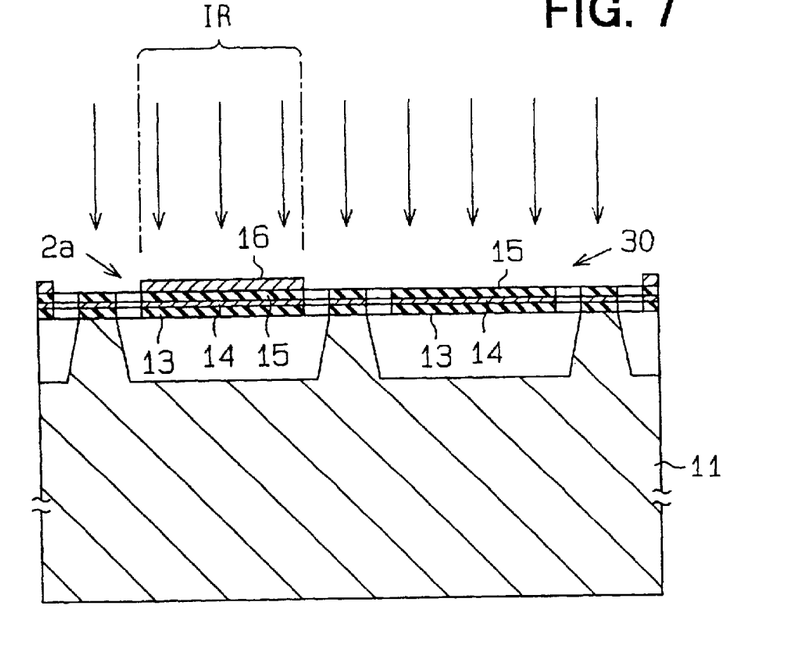
FIG. 7 is a cross-sectional view showing a case where a temperature compensation element is disposed adjacently to a sensor element on an identical plane.

As shown in FIG. 7, it is assumed that one temperature compensation element 30 is provided on an identical substrate with plural sensor elements 2a each having a membrane structure. The resistor 14 of each sensor element 2a has a value of resistance Rs(Ω) that is represented by formula (1) of;

$$Rs = R_0 \cdot (1 + (Tk + (Hk + Hr) \cdot \beta) \cdot \alpha) \tag{1}$$

where $R_0$ is a reference value of resistance, α (° C.$^{-1}$) is a resistor temperature coefficient, β (K/Watt) is a temperature rise coefficient of the membrane, Tk is a reference substrate temperature, Hk (Watt) is an environmental temperature radiant quantity, and Hr (Watt) is infrared radiation energy condensed by the lens.

The resistor of the temperature compensation element 30 has a value of resistance Rr represented by formula (2) of:

$$Rr = R_0 \cdot (1 + (Tk + Hk \cdot \beta) \cdot \alpha) \tag{2}$$

The differential output between the sensor element 2a and the temperature compensation element 30 is represented by formula (3) of:

$$Rs - Rr = R_0 \cdot (Hr \cdot \beta) \cdot \alpha \tag{3}$$

Accordingly, infrared radiation energy Hr can be obtained.

Figure 8A:
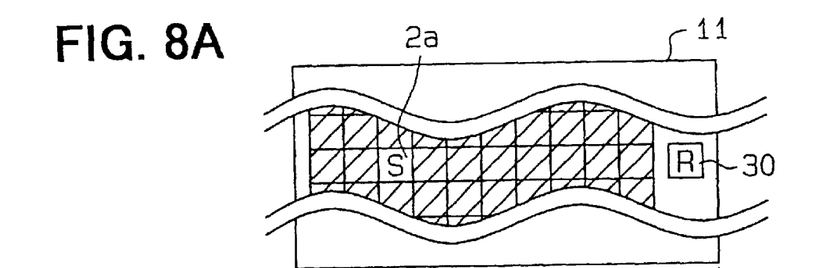
FIGS. 8A and 8B are diagrams for explaining a change in resistance and a differential output in case where only one temperature compensation element is provided.
Figure 8B:
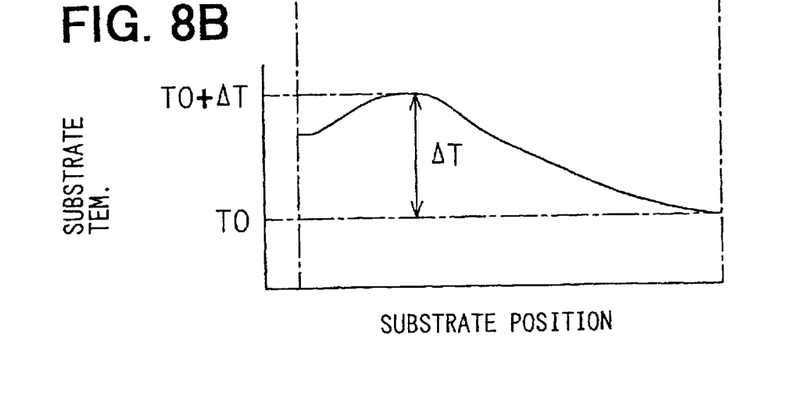

However, if the temperature distribution occurs on the silicon substrate 11 in the case where the number of the temperature compensation element 30 is only one (or less than the number of pixels) on the silicon substrate 11 as shown in FIG. 8A, temperature difference ΔT arises on the substrate 11 between the temperature compensation element 30 and the sensor element 2a provided remotely as shown in FIG. 8B. The differential output at that time is represented by formula (4) of:

$$Rs - Rr = R_0 \cdot (\Delta T + Hr \cdot \beta) \cdot \alpha \tag{4}$$

Then, the error corresponding to the temperature difference ΔT is produced.

Figure 9A:
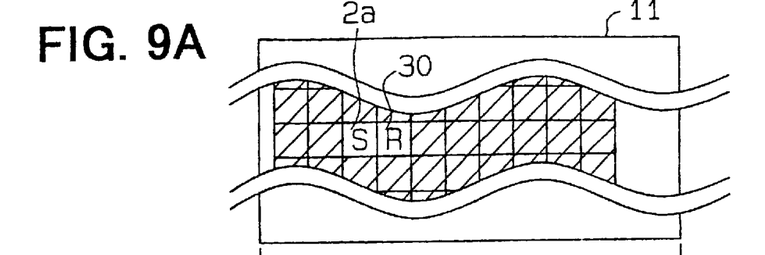
FIGS. 9A and 9B are diagrams for explaining a change in resistance and a differential output in case where a sensor element and a temperature compensation element are provided adjacently to each other on an identical plane in the first embodiment.
Figure 9B:
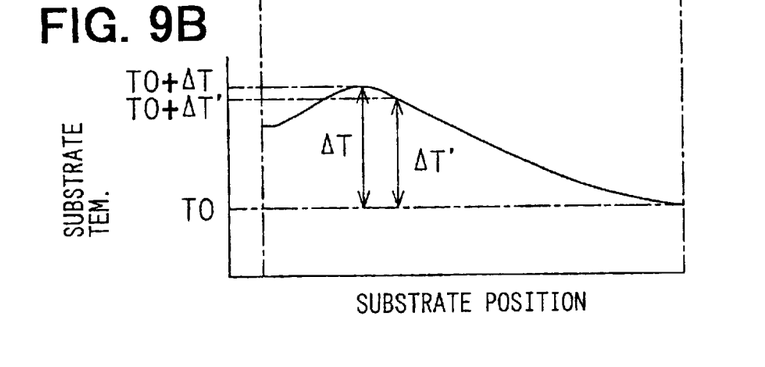

Even in such a case, as shown in FIGS. 9A and 9B, when the sensor element 2a and the temperature compensation element 30 are adjacent to each other as in the present embodiment, the difference in temperature between the two elements is extremely small in comparison with the temperature distribution on the entire substrate. In addition, in the example described above referring to FIGS. 8A and 8B, although the reference value of resistance $R_0$ is made identical, the variation is easily produced due to the deposition conditions or the like when the resistor is formed in practice. Even in such a case, the difference in variation can be minimized by IC manufacture techniques (mask) and the like when the temperature compensation element 30 is provided adjacently to the sensor element 2a as in the present embodiment.

The temperature compensation element 30 performs temperature correction to the output of the sensor element 2a by outputting the difference in output between the sensor element 2a and the corresponding (adjacent) temperature compensation element 30. Accordingly, the effects of the change in environmental temperature can be reduced, thereby making the output stable.

Thus, the present embodiment has the following advantages.

The temperature compensation element 30 is provided for every sensor element 2a at the position adjacent to the sensor element 2a on the silicon substrate 11. Accordingly, even when the temperature varies on the substrate 11 on which the sensor array 2 is provided, the temperature at the temperature compensation element 30 can be made approximately equal to that at the sensor element 2a. In consequence, stable output can be attained even when the environmental temperature varies. This temperature compensation element 30 is so constructed on the substrate 11 that infrared radiation condensed by the lens can be used effectively.

Specifically, when the environmental temperature varies, it is difficult to obtain stable output due to the characteristic difference from the practical temperature compensation element. In such a case, generally, a measurement instrument such as a Peltier element is used to keep the environmental temperature constant. However, this method requires high cost and large electric power consumption. Further, it is difficult to keep the environmental temperature constant by the Peltier element in a space such as a passenger compartment of a vehicle where the environmental temperature varies largely.

Therefore, it is conceivable that the temperature compensation element is provided at every pixel corresponding to each sensor element, in order to reduce the change in output caused by the varied environmental temperature. Here, if the temperature compensation element 30 is provided simply adjacently to the sensor element 2a, infrared radiation condensed by the condenser lens is radiated not only on the sensor element 2a but also on the temperature compensation element 30 because the condensed infrared radiation is irradiated on the entire area of the sensor array. If the temperature sensor element 30 is covered not to receive infrared radiation, the infrared radiation condensed on the temperature sensor element 30 becomes loss, so that defects would be produced in the detection area.

Therefore, in the arrayed sensor elements, it is preferable that the entire quantity of the infrared radiation condensed onto the substrate can be received (absorbed) by the sensor elements (by the sensor array). That is, it is preferable to increase, as large as possible, an effective area ratio of the area capable of absorbing the infrared radiation with respect to the entire area to which the infrared radiation condensed by the lens reaches. In the infrared image sensor of the present embodiment, the temperature compensation element 30 is provided for each pixel at the side of the non-irradiation surface of the substrate 11. Therefore, the infrared radiation condensed by the lens can be utilized effectively.

Second Embodiment

Figure 10A:
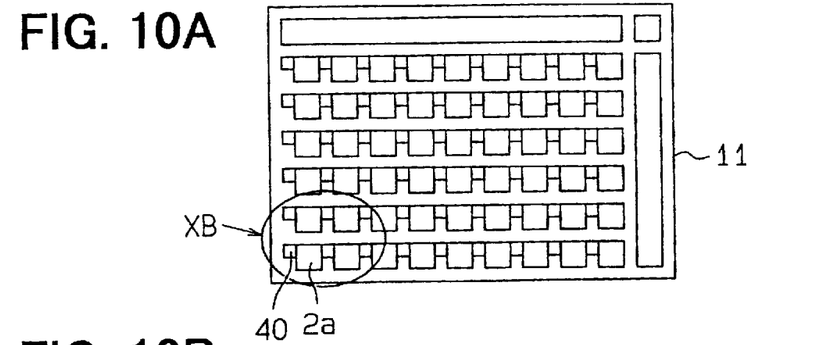
FIG. 10A is a plan view showing an infrared image sensor in a second embodiment of the present invention.
Figure 10B:
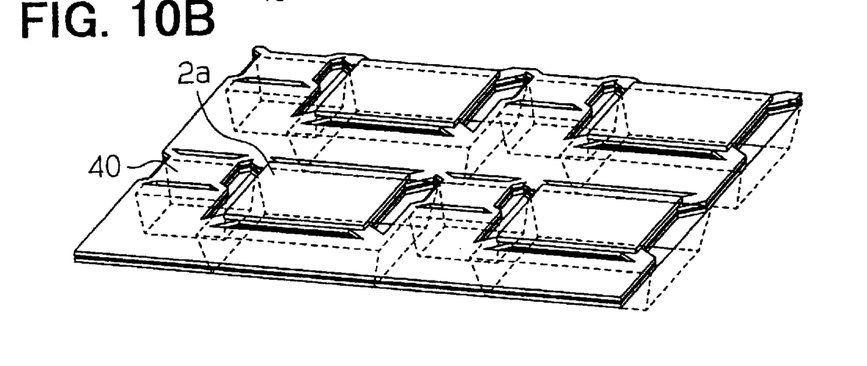
FIG. 10B is a perspective view showing a part encircled with arrow XB in FIG. 10A.

Next, a second embodiment of the present invention is explained focusing on differences from the first embodiment. In the second embodiment, as shown in FIGS. 10A and 10B, a temperature compensation element 40 and a sensor element 2a are formed on an identical plane (the same side of the substrate) at positions adjacent to each other. The temperature compensation element 40 is formed for every sensor element 2a adjacently to each other. Further, the area of the temperature compensation element 40 is significantly smaller than that of the sensor element 2a. The value of resistance of the temperature compensation element 40 is controlled to be equal to that of the sensor element 2a. Accordingly, infrared radiation can be utilized effectively with little loss without utilizing the opening portion of the recess 33 shown in FIG. 6.

Third Embodiment

Next, a third embodiment of the present invention is explained focusing on differences from the first embodiment.

Figure 11A:
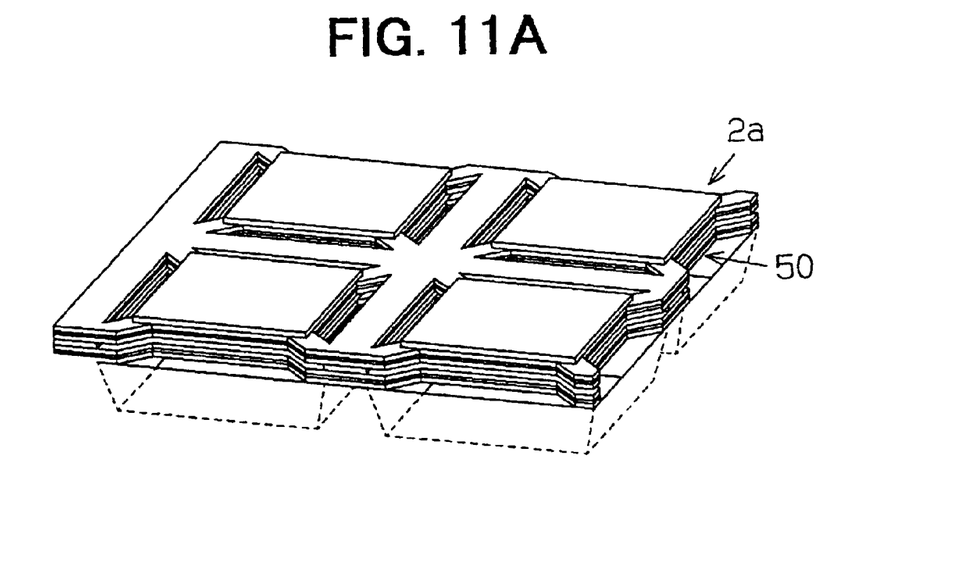
FIG. 11A is a perspective view showing an infrared image sensor in a third embodiment of the present invention.
Figure 11B:
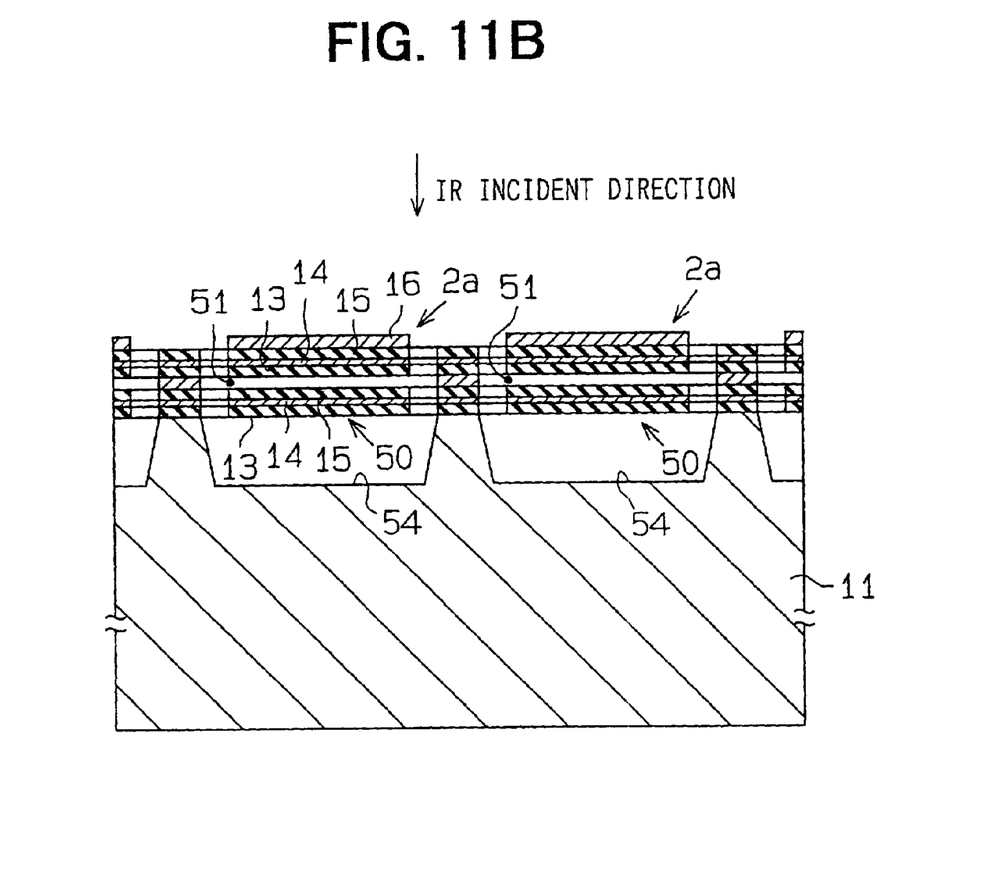
FIG. 11B is a cross-sectional view showing the infrared image sensor in the third embodiment.

In the third embodiment, as shown in FIGS. 11A and 11B, a temperature compensation element 50 is disposed below the sensor element 2a at a downstream side in an incident direction of infrared radiation to the silicon substrate 11. That is, the temperature compensation element 50 is provided for every sensor element 2a to overlap with the sensor element 2a in the silicon substrate 11. In other words, the temperature compensation element 50 is formed at a region (surface region) of the silicon substrate 11 identical with that of the sensor element 2a. A gap 51 is provided between the temperature compensation element 50 and the sensor element 2a.

In the case where the temperature compensation element 50 is disposed overlapping with the sensor element 2a in the incident direction of infrared radiation, the substrate temperatures at the part of the sensor element 2a and at the part of the temperature compensation element 50 can be made approximately equal to each other even when the substrate temperature varies on the sensor surface. In other words, because the temperature compensation element 50 and the sensor element 2a are provided at the identical region of the surface of the semiconductor substrate 11 in the incident direction of infrared radiation, the temperature of the temperature compensation element 50 can be made approximately equal to that of the sensor element 2a (so that the effect of the temperature distribution on the substrate can be minimized) even when the substrate temperature varies.

On the incident side of infrared radiation, only the sensor element 2a exists on the substrate surface. Therefore, the condensed infrared radiation can be utilized more effectively in comparison with the case where they are disposed adjacently to each other on the identical plane. Further, because the temperature compensation element 50 is disposed below the sensor element 2a, the condensed infrared radiation can be prevented from entering the temperature compensation element 50 without using a special cover. Furthermore, the gap 51 provided between the sensor element 2a and the temperature compensation element 50 thermally insulates the sensor element 2a, so that the rise in temperature due to the condensed infrared radiation can be imparted only to the sensor element 2a.

Figure 12A:
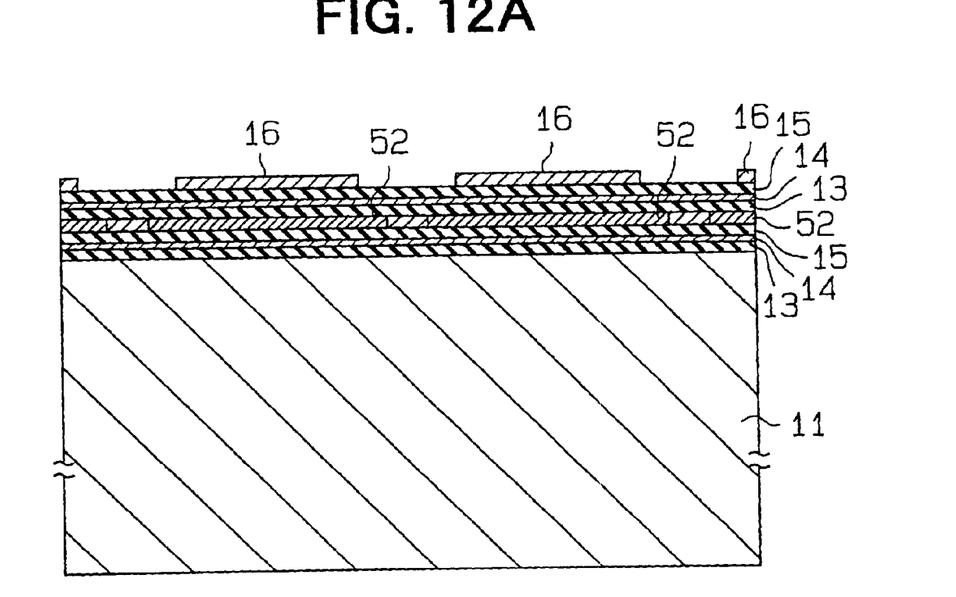
FIGS. 12A and 12B are cross-sectional views for explaining a manufacturing process of the infrared image sensor in the third embodiment.
Figure 12B:
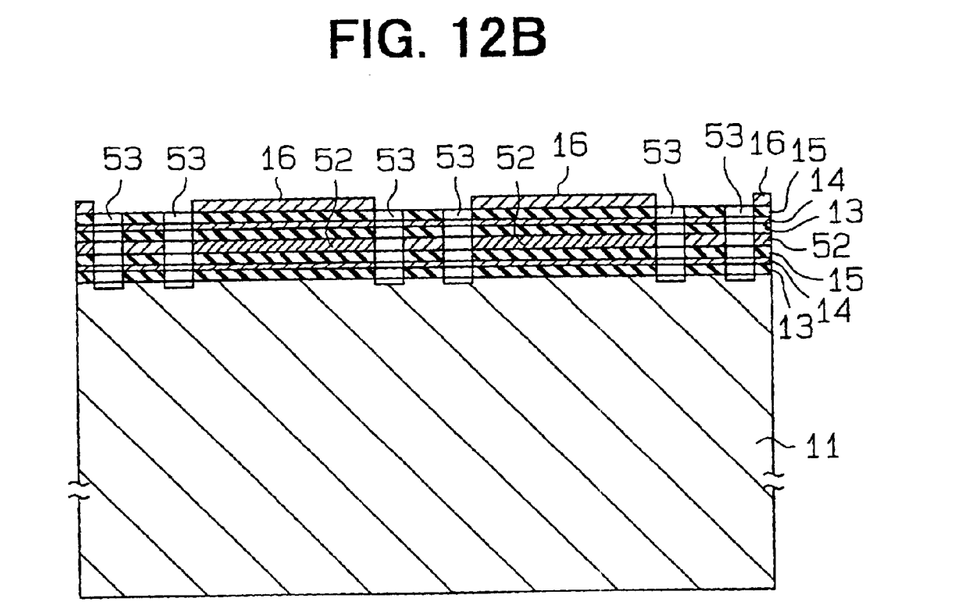

The following manufacturing process is applicable to obtain this structure. Specifically, first, as shown in FIG. 12A, after the films 13, 14, and 15 for forming the temperature compensation element 50 is formed on the silicon substrate 11, a sacrifice layer 52 is deposited, which is to be removed at etching for forming a recess 54 shown in FIG. 11. Further, the films 13, 14, 15 and 16 for forming the sensor element are formed thereon. Then, after etching holes 53 are formed as shown in FIG. 12B, etching is performed. Accordingly, not only the silicon substrate 11 but also the sacrifice layer 52 is etched simultaneously. As a result, the temperature compensation element (membrane structure) 50 can be disposed below the sensor element (membrane structure) 2a in an overlapping state with each other in the incident direction of infrared radiation on the silicon substrate 11.

Figure 13A:
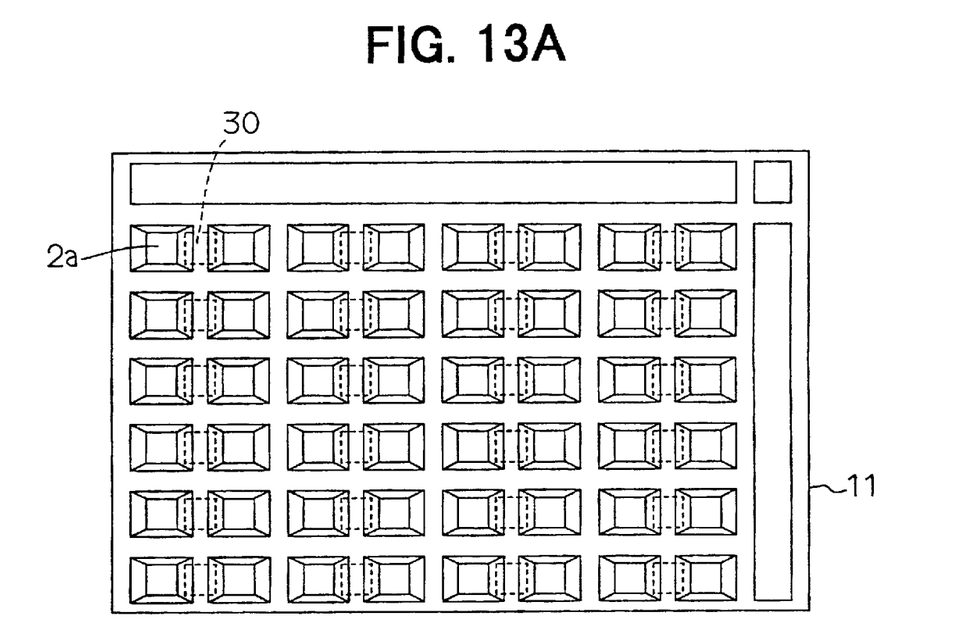
FIGS. 13A and 13B are plan views showing infrared image sensors as modified embodiments of the present invention.

In the above-mentioned embodiments, although the temperature compensation element 30 is provided for each sensor element 2a, the present invention is not limited to that. For example, referring to FIG. 13A, the temperature compensation element 30 may be provided for each two sensor elements 2a forming one block. Even in this structure, the temperatures of the sensor elements 2a can be made approximately equal to that of the corresponding temperature compensation element 30. In consequence, stable output can be attained even when the substrate temperature varies.

Figure 13B:
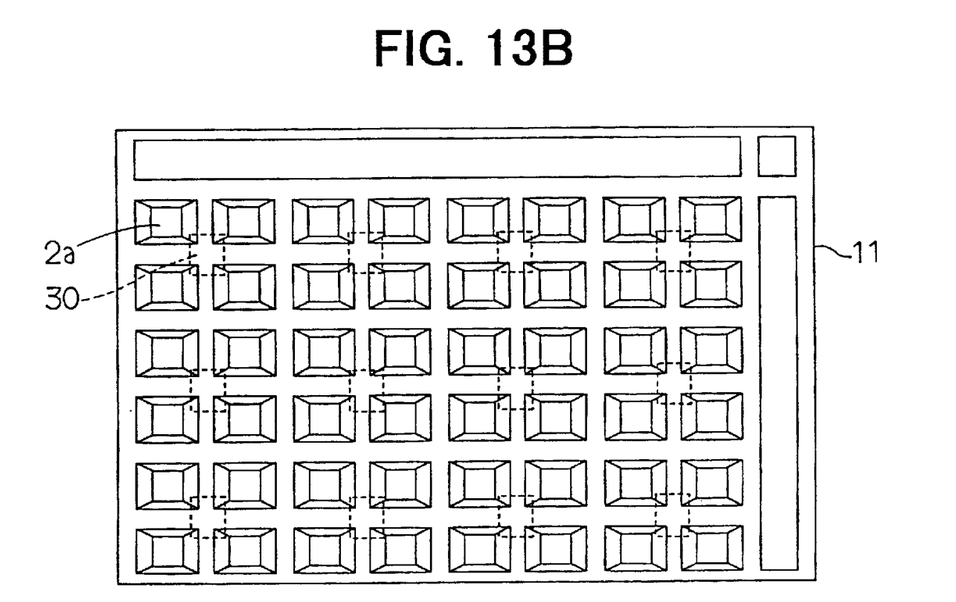

Also, as shown in FIG. 13B, the temperature compensation element 30 may be provided for each four sensor elements 2a forming one block, and in this case, the same advantages can be provided as well. However, preferably, the temperature compensation element should be disposed for each sensor element 2a because the difference in temperature between the two elements 30, 2a can be reduced further, resulting in more accurate output.

In the above-mentioned embodiments, although the present invention is applied to the case adopting the bolometer type sensor element as a thermal type sensor element, the present invention may be applied to other cases adopting a pyroelectric type, a thermopile type, and the like as the thermal type sensor element. The infrared image sensor of the present invention can be applied to various home electric products, industrial products, or the like utilizing detection of human position, in addition to vehicles.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An infrared image sensor comprising:
   a semiconductor substrate;
   a sensor array comprising a plurality of sensor elements provided on the semiconductor substrate, the plurality of sensor elements for respectively providing thermal image data by receiving infrared radiation from a measurement member; and
   a plurality of temperature compensation elements provided on the semiconductor substrate, each of the plurality of temperature compensation elements being arranged adjacent to a corresponding one of the plurality of sensor elements, and each of the plurality of temperature compensation elements for performing temperature correction to an output of the corresponding one of the plurality of sensor elements.

2. The infrared image sensor according to claim 1, wherein each of the plurality of sensor elements and the plurality of temperature compensation elements has a membrane structure.

3. The infrared image sensor according to claim 1, wherein an area of the each temperature compensation element is smaller than that of the corresponding one of the plurality of sensor elements.

4. The infrared image sensor according to claim 1, wherein the each temperature compensation element performs the temperature correction to the output of the corresponding one of the sensor elements, based on a difference between an output of the each temperature compensation element and the output of the corresponding one of the sensor elements.

5. An infrared image sensor comprising:
   a semiconductor substrate;
   a sensor array comprising a plurality of sensor elements provided on the semiconductor substrate, the plurality of sensor elements for respectively providing thermal image data by receiving infrared radiation from a measurement member, wherein each of the plurality of sensor elements is formed with a through hole passing through the semiconductor substrate from an irradiation surface of the semiconductor substrate, on which the infrared radiation is incident, to a non-irradiation surface of the semiconductor substrate at an opposite side of the irradiation surface; and
   a plurality of temperature compensation elements provided on the semiconductor substrate, each of the plurality of temperature compensation elements being arranged adjacent to a corresponding one of the plurality of sensor elements for performing temperature correction to an output of the corresponding one of the plurality of sensor elements, wherein the plurality of temperature compensation elements are provided on the non-irradiation surface of the semiconductor substrate.

6. The infrared image sensor according to claim 2, wherein each of the plurality of temperature compensation elements is provided above a recess that is formed on the non-irradiation surface of the semiconductor substrate.

7. The infrared image sensor according to claim 5, wherein first and second sensor elements of the plurality of sensor elements, arranged adjacent to each other, respectively have through holes, the through holes having opening portions that are adjacent to each other on the irradiation surface of the semiconductor substrate.

8. The infrared image sensor according to claim 7, further comprising a condenser lens disposed between the semiconductor substrate and the measurement member for condensing the infrared radiation from the measurement member onto the sensor array, wherein:
   imaging regions by the condenser lens for the first and second sensor elements correspond to the opening portions of the first and second sensor elements.

9. The infrared image sensor according to claim 5, wherein a side surface of the through hole is coated with a high-reflectance film.

10. An infrared image sensor comprising:
    a semiconductor substrate;
    a sensor array comprising a plurality of sensor elements provided on the semiconductor substrate, the plurality of sensor elements for respectively providing thermal image data by receiving infrared radiation from a measurement member; and
    a plurality of temperature compensation elements provided on the semiconductor substrate, each of the plurality of temperature compensation elements being arranged adjacent to a corresponding one of the plurality of sensor elements and being disposed at a downstream side of the corresponding one of the plurality of sensor elements in an incident direction of the infrared radiation to the semiconductor substrate, and each of the plurality of temperature compensation elements for performing temperature correction to an output of the corresponding one of the plurality of sensor elements.

11. The infrared image sensor according to claim 10, wherein a gap is defined between the each temperature compensation element and the corresponding one of the sensor elements.

12. An infrared image sensor comprising:
    a semiconductor substrate;
    a sensor array disposed on the semiconductor substrate and comprising a plurality of blocks, each of the plurality of blocks comprising a plurality of sensor elements, the plurality of sensor elements respectively for providing thermal image data by receiving infrared radiation from a measurement member; and
    a plurality of temperature compensation elements provided on the semiconductor substrate, each of the plurality of temperature compensation elements being arranged adjacent to a corresponding one of the plurality of blocks for performing temperature correction to outputs from the plurality of sensor elements.

13. An infrared image sensor comprising:

a semiconductor substrate having an irradiation surface on which infrared radiation is incident and a non-irradiation surface on an opposite side of the irradiation surface;

a sensor array disposed on the semiconductor substrate and comprising a plurality of blocks, each of the plurality of blocks comprising a plurality of sensor elements, the plurality of sensor elements respectively for providing thermal image data by receiving infrared radiation from a measurement member; and a plurality of temperature compensation elements provided on the semiconductor substrate, each of the plurality of temperature compensation elements being arranged adjacent to a corresponding one of the plurality of blocks for performing temperature correction to outputs from the plurality of sensor elements, wherein the plurality of temperature compensation elements are provided on the non-irradiation surface so that the infrared radiation is prevented from entering the plurality of temperature compensation elements.

14. The infrared image sensor according to claim 13, wherein the through hole is tapered toward the resistor.

15. The infrared image sensor according to claim 13, wherein a side surface of the through hole is coated with a high-reflectance film for reflecting the infrared radiation.

16. An infrared image sensor comprising:

a semiconductor substrate having an irradiation surface on which infrared radiation is incident and a non-irradiation surface on an opposite side of the irradiation surface;

a sensor array disposed on the semiconductor substrate and comprising a plurality of blocks, each of the plurality of blocks comprising a plurality of sensor elements, the plurality of sensor elements respectively for providing thermal image data by receiving infrared radiation from a measurement member, wherein each of the plurality of sensor elements has a through hole opening on the irradiation surface of the semiconductor substrate for receiving the infrared radiation, and a resistor at a bottom of the through hole, and the resistor has a resistance that is changed by the infrared radiation; and a plurality of temperature compensation elements provided on the semiconductor substrate, each of the plurality of temperature compensation elements being arranged adjacent to a corresponding one of the plurality of blocks for performing temperature correction to outputs from the plurality of sensor elements.

17. An infrared image sensor comprising:

a semiconductor substrate;

a sensor array comprising a plurality of sensor elements provided on the semiconductor substrate, the plurality of sensor elements for respectively providing thermal image data by receiving infrared radiation from a measurement member; and a plurality of temperature compensation elements provided on the semiconductor substrate, each of the plurality of temperature compensation elements being arranged adjacent to a corresponding one of the plurality of sensor elements, and each of the plurality of temperature compensation elements for performing temperature correction to an output of the corresponding one of the plurality of sensor elements based on an output of a corresponding one of the plurality of temperature compensation elements.

18. An infrared image sensor comprising:

a semiconductor substrate;

a sensor array disposed on the semiconductor substrate and comprising a plurality of blocks, each of the plurality of blocks comprising a plurality of sensor elements, the plurality of sensor elements respectively for providing thermal image data by receiving infrared radiation from a measurement member; and a plurality of temperature compensation elements provided on the semiconductor substrate, each of the plurality of temperature compensation elements being arranged adjacent to a corresponding one of the plurality of blocks for performing temperature correction to outputs from the plurality of sensor elements based on an output of a corresponding one of the plurality of temperature compensation elements.

* * * * *